US010998166B2

United States Patent
Straka et al.

(10) Patent No.: US 10,998,166 B2
(45) Date of Patent: May 4, 2021

(54) SYSTEM AND METHOD FOR BEAM POSITION VISUALIZATION

(71) Applicant: FEI Company, Hillsboro, OR (US)

(72) Inventors: Branislav Straka, Brno (CZ); Radek Smolka, Brezina (CZ); Lukas Kral, Ivancice (CZ); Jan Skalicky, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/712,553

(22) Filed: Dec. 12, 2019

(65) Prior Publication Data

US 2021/0035775 A1 Feb. 4, 2021

Related U.S. Application Data

(60) Provisional application No. 62/880,009, filed on Jul. 29, 2019.

(51) Int. Cl.
*H01J 37/28* (2006.01)

(52) U.S. Cl.
CPC ....... *H01J 37/28* (2013.01); *H01J 2237/2817* (2013.01); *H01J 2237/2826* (2013.01)

(58) Field of Classification Search
CPC ............... H01J 37/28; H01J 2237/2817; H01J 2237/2826
See application file for complete search history.

(56) References Cited

U.S. PATENT DOCUMENTS

2017/0018394 A1* 1/2017 Sohda ................. H01J 37/28

* cited by examiner

*Primary Examiner* — Nicole M Ippolito
*Assistant Examiner* — Hanway Chang
(74) *Attorney, Agent, or Firm* — Klarquist Sparkman, LLP

(57) ABSTRACT

A charged-particle beam (CPB) is aligned to a primary axis of a CPB microscope by determining a first beam deflection drive to a beam deflector for directing the CPB passing a reference location displaced from the primary axis. The beam deflector is provided with a second beam deflection drive during the working mode of the CPB microscope to propagate the beam along the primary axis. The second beam deflection drive is determined based on the first beam deflection drive.

19 Claims, 9 Drawing Sheets

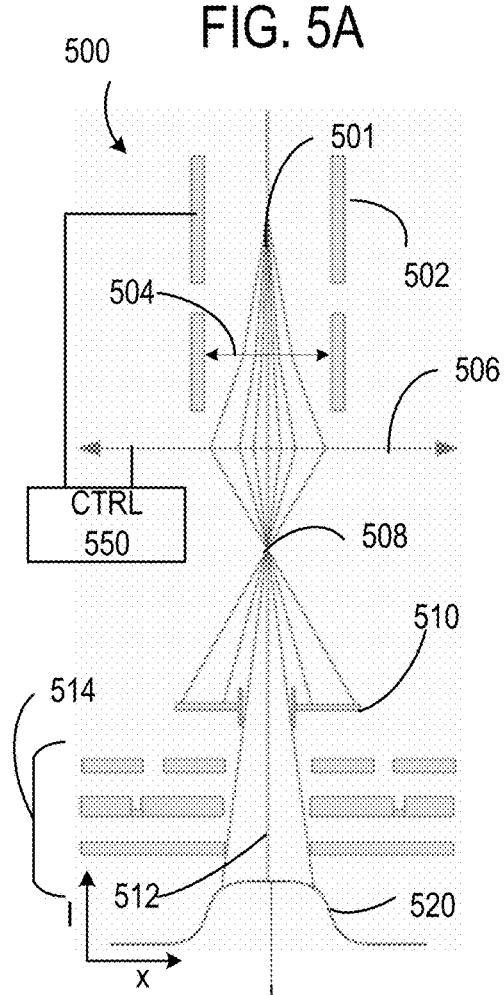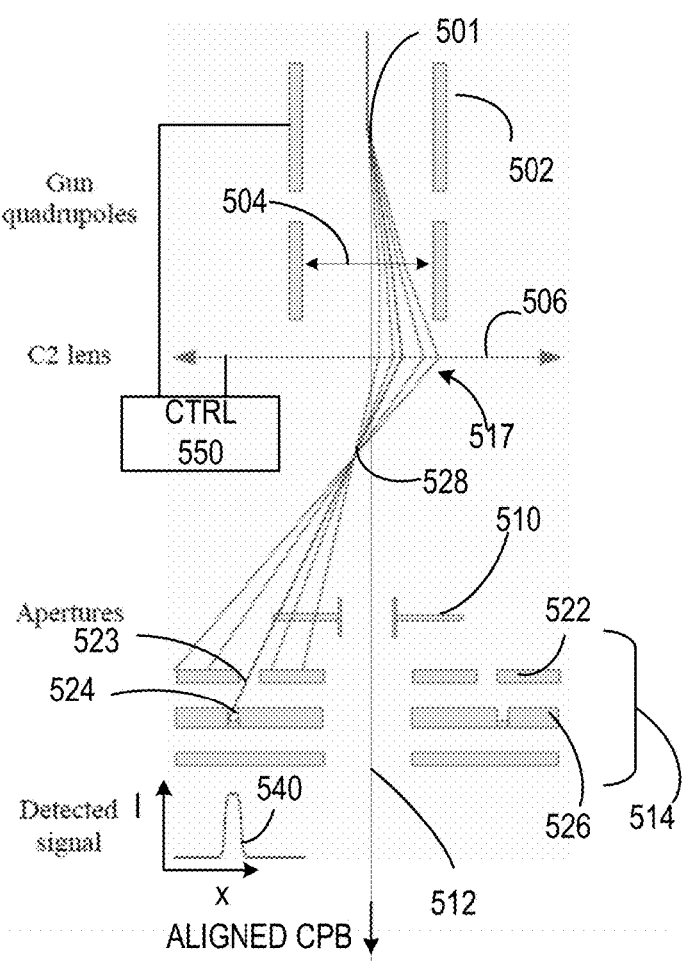

SYSTEM AND METHOD FOR BEAM POSITION VISUALIZATION

CROSS REFERENCE TO RELATED APPLICATION

This application claims the benefit of U.S. Provisional Application No. 62/880,009, filed Jul. 29, 2019, which is hereby incorporated by reference in its entirety.

FIELD

The disclosure pertains to method and system for charged particle beam alignment.

BACKGROUND

In typical electron microscopes, beams must be realigned periodically to correct for drifts or other changes in the microscope. Whether the alignments are performed manually or automatically, they can be time-consuming and tedious. Improved approaches are needed.

SUMMARY

The disclosure pertains to alignment of charged-particle beams (CPBs) in CPB systems such as imaging and processing systems using ion beams or electron beams. In some examples, automated methods permit CPB alignment in electron microscopes without technician assistance. In some examples, charged-particle beam (CPB) microscopes comprise a beam deflector operable to deflect a CPB and a detector displaced from a primary axis of the CPB microscope for beam alignment. During operation in a CPB alignment mode, an alignment deflection drive is provided to the beam deflector to direct at least a portion of the CPB to a reference location displaced from a primary axis, wherein the reference location is defined by the detector. The CPB passes the reference location when the central axis of the CPB passes the reference location. During operation in a CPB working mode, such as during sample imaging and sample processing, a working deflection drive is applied to the beam deflector to direct the CPB along the primary beam axis, with the working deflection drive as determined based on the alignment deflection drive.

The reference location may be defined by the detector. For example, the reference location is determined by one or more of the location, the size, and the shape of the detector. The reference location may be at a constant distance from the detector.

During CPB alignment, the beam deflector may be driven to scan the CPB relative to the reference location. At least a portion of the scanned CPB beam may be detected by the detector. The detected signals, as well as the corresponding beam deflection drive for scanning the beam, are used for determining the alignment deflection drive. The change of the alignment deflection drive between alignments at different times may indicate beam drift or beam misalignment. A correction deflection may be determined based on the change of the alignment deflection drive and used for re-aligning the CPB along the primary axis. For example, the working deflection drive may be updated by adding the correction deflection to the current working deflection drive. The beam deflector may then be supplied with the updated working deflection drive during the working mode to realign the CPB with the primary axis of the microscope. In some examples, during the working mode, the realigned CPB may be deflected by a second beam deflector to scan the CPB relative to the sample.

In some examples, the reference location may be defined by a reference aperture situated at a fixed displacement from the primary axis. The detector is situated to receive CPB beam portions transmitted through the reference aperture, and the CPB detector can include the reference aperture.

The beam deflector, the detector and the CPB source may be positioned in a portion of the CPB microscope hermetically separated from the portion of the CPB microscope in which the sample is situated using column isolation valve. In this way, the CPB may be automatically aligned during sample exchange or during venting or pumping of the CPB system.

In one example, the detector may be a part of an alpha zoom lens (AZL) for determining a beam angle of the primary beam and the resulting resolution of the primary beam. The AZL may include at least a first electrode and a second electrode, wherein the first electrode defines an aperture, and the second electrode defines a detector. The beam deflector may scan the CPB relative to the detector for determining the correction deflection during CPB alignment. The working deflection drive, adjusted based on the correction deflection, is then applied to the beam deflector to direct the CPB through the aperture, along the primary axis, during the working mode.

The foregoing and other features and advantages of the disclosed technology will become more apparent from the following detailed description, which proceeds with reference to the accompanying figures.

BRIEF DESCRIPTION OF THE DRAWINGS

FIG. 5A illustrates a CPB microscope in working mode.

FIG. 5B illustrates the CPB microscope in alignment mode.

DETAILED DESCRIPTION

Introduction

Figure 1:
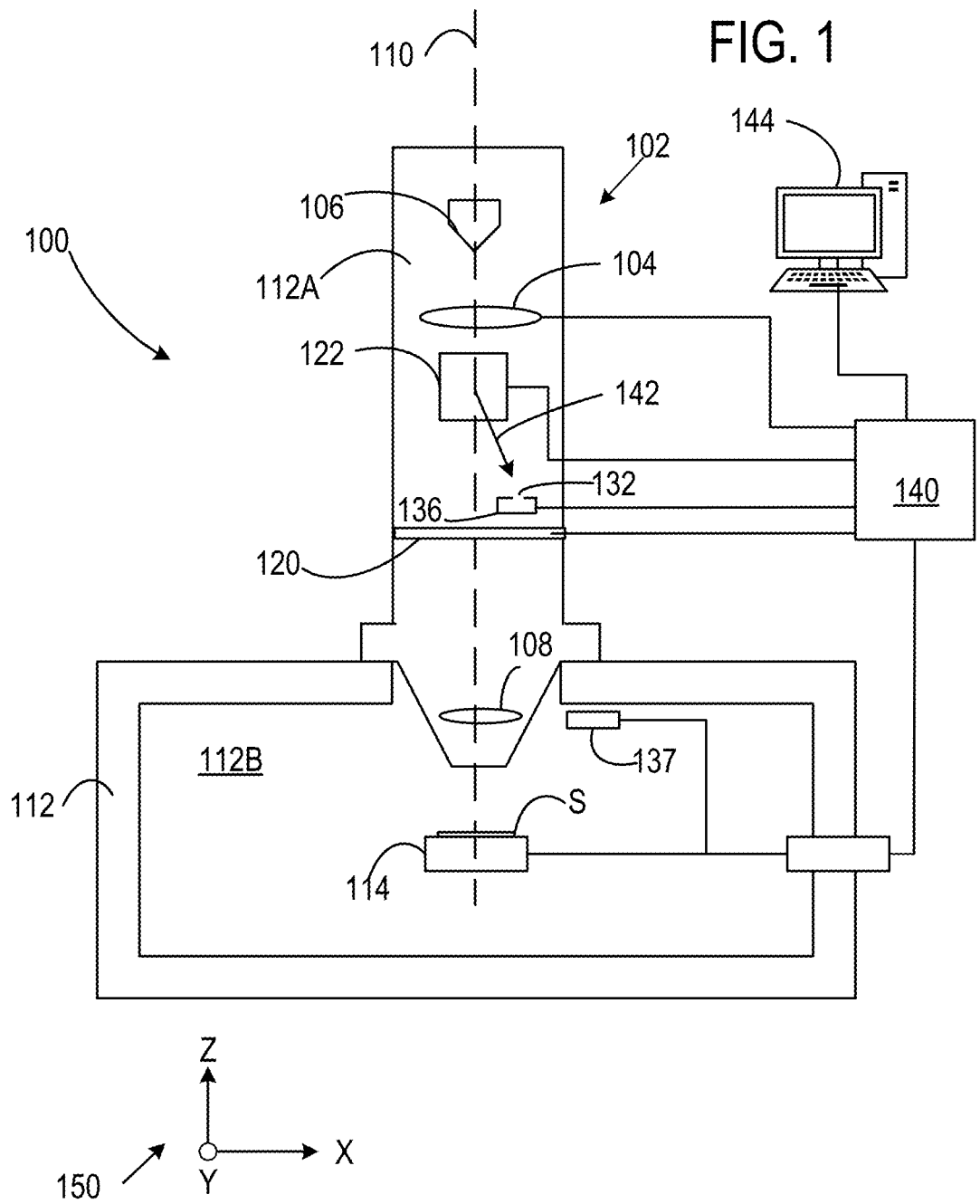
FIG. 1 illustrates a representative charged-particle beam (CPB) system that includes a CPB microscope.

In the following, representative examples of CPB systems such as CPB microscopes and related components, subcomponents, and methods are disclosed. In many practical examples, electron beams are of interest, but the examples are described with reference to arbitrary CPBs. In most examples, additional CPB components such as lenses, deflectors, stigmators, and additional apertures are used, but are not shown for convenient illustration. The disclosed methods and apparatus can be used in both transmission and scanning microscopy in acquiring sample images and diffraction patterns. As discussed below, in some examples, a vacuum chamber is divided into two or more regions that are separated by a valve so that vacuum at the CPB source can be maintained as samples are exchanged or manipulated. In such examples, CPB alignment can be performed during sample exchange or at other times. In other examples, such multiple vacuum regions are not available, but in any case, alignment can be performed as needed, without additional user attention at times at which samples are not under investigation. In some examples, measured values of beam currents and associated deflection drives are stored in a computer-readable medium as one or more images, and such data can be referred to as an image. Image can also be used to refer to a presentation of such data on a display for visual inspection by an operator, although in many practical examples, operator intervention is avoided.

As used herein, X and Y are used to refer to beam deflections that are produced along X and Y axes that are orthogonal to a CPB propagation axis. Such axes need not be mutually perpendicular, and for two-dimensional correction, any two axes that are not parallel to each other and a beam propagation axis can be used. In most examples, two dimensional CPB deflection is of interest, but deflection and CPB correction can be performed along a single axis. In the examples below, a single reference point is used for measurement of X and Y offsets and beam deflection drives, but different reference points can be used. Circular apertures are convenient, but apertures of other shapes can also be used such as ellipses, polygons, ovals, slots, etc. Such a reference aperture can be defined in a plate that includes an aperture for the CPB with the CPB system in use, but in some examples, an aperture plate is offset from a primary CPB axis. CPB beam detection is described with reference to Faraday cups but other detectors such as microchannel plates can be used. Although generally more difficult to implement in practical systems, a reference beam block or obstruction can be used instead of a reference aperture. In the examples, a CPB is scanned with respect to a reference point, but the reference point can be scanned with a fixed beam deflection.

In some examples, various components are energized, activated, or controlled by application of drive values, drive signals, or other values. Signals applied to beam deflectors and associated with X and Y deflections are referred to as beam deflection drive values or beam deflection drive. Measured values associated with CPBs are typically referred to as beam currents. However, the beam deflection drive values and CPB beam currents and other quantities can be associated with electrical currents, voltages, or combinations thereof, and a particular representation as a time varying electrical voltage or current is for convenient explanation. In the disclosed examples, beam deflection is described as a linear function of beam deflection drive, but nonlinear responses can be used as well, with suitable calibration and/or compensation. Typically beam deflections or beam deflection drive can be conveniently used to align a CPB with a selected axis, particularly if the relationship between beam deflection and beam deflection drive is relatively simply, such as a linear relationship or is known.

Example 1

Referring now to FIG. 1, in a representative embodiment, a charged particle beam (CPB) system 100 includes a CPB microscope 102 such as a scanning electron microscope (SEM) or a transmission electron microscope (TEM) and comprises one or more CPB lenses such as a condenser lens 104 that is situated to direct a CPB from a CPB source 106 towards an objective lens 108. The CPB source 106 can be, for example, a field emitter that produces an electron beam, but other sources can be used. In some embodiments, one or more additional CPB lenses can be provided, and can be magnetic lenses and/or electrostatic lenses. A primary axis 110 may be determined during manufacturing the microscopy system. Typically, the CPB is aligned with a primary axis 110 during working mode, while performing sample processing or sample imaging. For example, during the working mode, the CPB propagates along the primary axis towards the sample when the beam deflector 122 is provided with the working deflection drive.

The CPB system 100 includes a vacuum chamber 112 housing a movable sample holder 114 for retaining a sample S. The vacuum chamber 112 can be evacuated using vacuum pumps (not shown) and typically defines a first volume 112A that contains the CPB source 106 and selected other CPB optical components and a second volume 112B that is situated to receive the sample S and the movable sample holder 114. A column isolation valve (CIV) 120 is situated to separate the first volume 112A and the second volume 112B. Typically, the CIV 120 is operable to hermetically isolate the first volume 112A from the second volume 112B during sample exchange. The sample holder 114 can be movable in an X-Y plane as shown with respect to a coordinate system 150, wherein a Y-axis is perpendicular to a plane of the drawing. The sample holder 114 can further move vertically (along a Z-axis) to compensate for variations in the height of the sample S. In some embodiments, the CPB microscope 102 can be arranged vertically above the sample S and can be used to image the sample S while an ion beam machines or otherwise processes the sample S.

The CPB system 100 can further comprise a computer processing apparatus 144 such as a control computer and a deflector controller 140 for controlling a beam deflector 122, CPB lenses 104, 108 and other CPB lenses and other components such as detectors and sample stages. The computer processing apparatus 144 can also control display of information gathered from or more CPB detectors on a display unit. In some cases, the computer processing apparatus 144 (e.g., the control computer) establishes various excitations, records image data, and generally controls operation of the CPB microscope 102.

The CPB from the CPB source 106 produces a CPB that can be focused, scanned, aberration corrected, cropped, expanded, energy or charge filtered, or otherwise processed by one or more CPB optical components. During working mode, the propagation direction of the CPB beam from the CPB source 106 is adjusted by the deflector 122 to propagate along the primary axis 110 for processing or imaging the sample S on the sample holder 114. The propagation direction may be adjusted by providing a working deflection drive to the beam deflector 122. The working deflection may be a constant signal. The working deflection drive may be determined during an alignment mode, by scanning the CPB relative to a reference location with the beam deflector 122. The reference location has an offset from the primary axis 110. The beam deflector 122 may be a quadrupole beam deflector situated to provide CPB deflections along the X-axis and Y-axis. In some examples, additional beam alignment can be performed by beam measurements at or near the movable substrate holder 114.

In some examples, the reference location may be defined by a reference aperture 132 situated at a fixed displacement from the primary axis 110. For example, the reference location may be a point on the reference aperture, such as the center of the reference aperture. A CPB detector 136 is situated to receive CPB beam portions transmitted through the reference aperture 132, and the CPB detector 136 can include the reference aperture. In one example, the reference aperture may be a virtual aperture defined by the detection area of the CPB detector 136. The CPB detector 136 may be positioned with an offset from the primary axis 110 to receive at least a portion of the deflected CPB beam. The CPB detector may detect the beam current or image a portion of the beam. In some embodiments, the CPB detector may be a Faraday cup. In some embodiments, the CPB detector 136 may be a two-dimensional detector, or other position sensitive detector. The CPB detector may be a solid-state detector, scintillator with photodiode, photomultiplier, or microchannel plate. In other examples, a separate aperture plate can be used. The CPB detector 136 is used only in the alignment mode, but not used in the working mode of the microscope. A second CPB detector 137 can be situated within the second volume 112B or elsewhere to receive flux, such as scattered charged particles or secondary emission, in response to a CPB incident on the sample S in the working mode of the microscope. The second CPB detector 137 is used only in the working mode for sample imaging or sample processing, but not used in the alignment mode.

The beam deflector 122 is coupled to the deflection controller 140 that is operable to energize the beam deflector 122 to provide various beam deflections. A representative deflection direction 142 is illustrated in FIG. 1. The deflection controller 140 energizes the beam deflector 122 to vary (or scan) CPB location with respect to the reference aperture 132 and record current transmitted by the reference aperture as a function of beam displacement or beam deflector drive values. Beam deflections (or beam deflection drive values) and current at the detector 136 are recorded and stored. The stored beam deflections and corresponding current may be utilized for CPB alignment.

Example 2

Figure 2A:
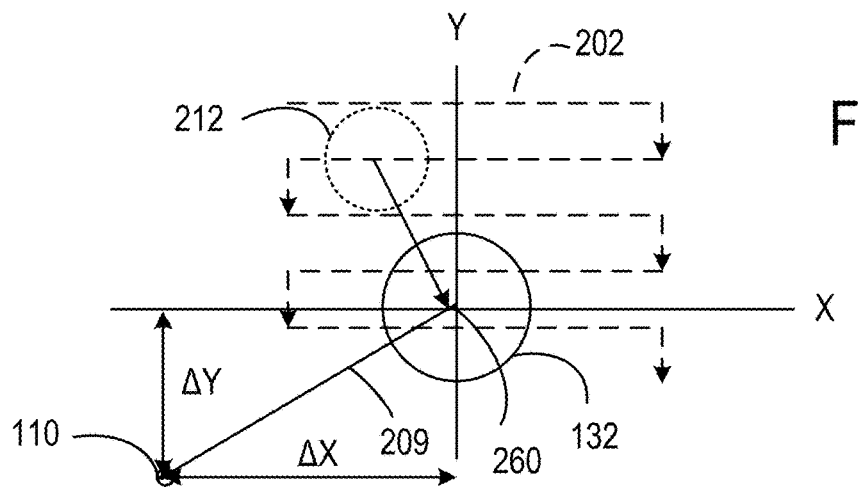
FIGS. 2A-2C illustrate representative CPB displacements from a reference location and CPB scanning paths with respect to the reference location and a primary axis.
Figure 2B:
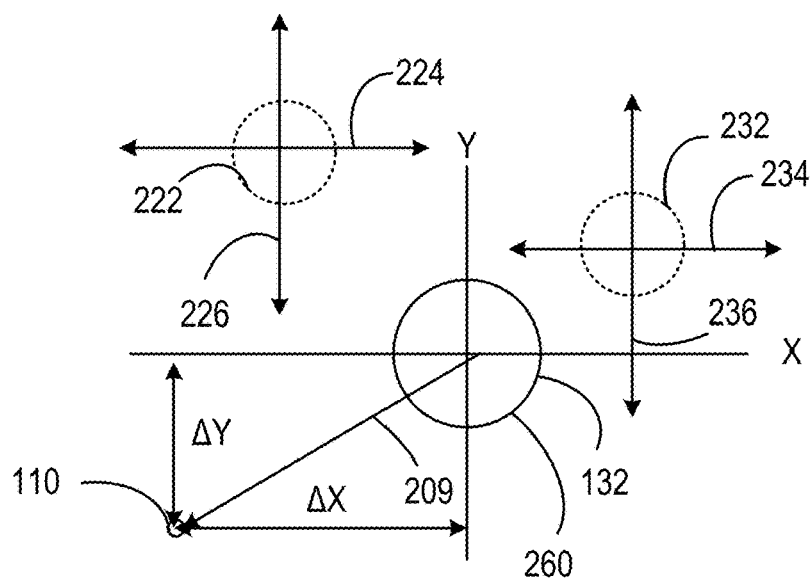
Figure 2C:
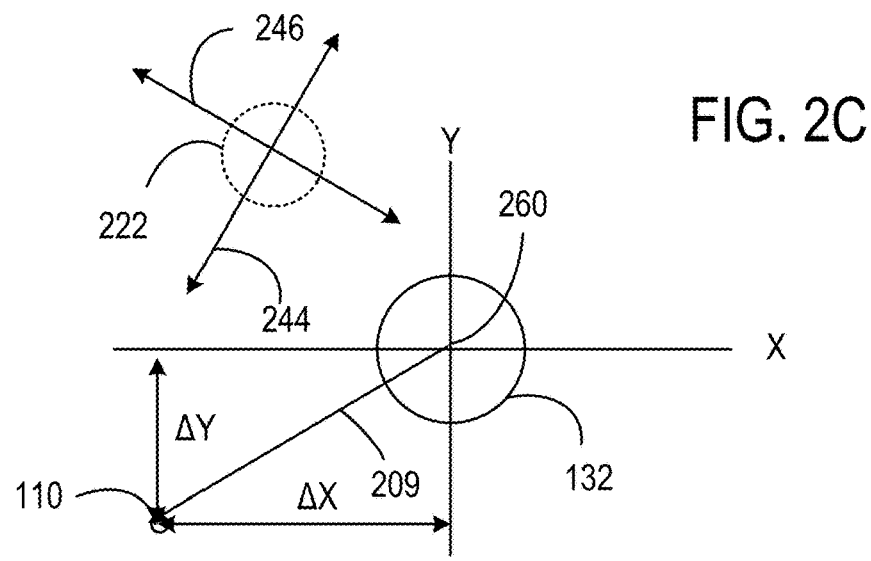

FIGS. 2A-2C illustrate representative scan paths produced with the beam deflector with respect to a reference location 260 displaced from the primary axis, such as the center of the reference aperture 132. The reference aperture 132 has displacements $\Delta X$, $\Delta Y$ from the primary axis 110. An operation deflector drive values $V_o$ may be applied to the beam deflector that would direct the CPB along the primary axis 110.

Referring to FIG. 2A, the deflection controller 140 energizes the beam deflector 122 to vary CPB location in a raster pattern 202 with respect to the reference location 260 and record transmitted beam current received at the detector 136. The CPB cross-section at the plane of aperture 132 is shown as 212, but can be larger or smaller than the reference aperture 132. The raster pattern 202 and the detected current can be used to produce an image based on beam current I as a function of position (X- and Y-coordinates) or associated deflection drive ($V_X$, $V_Y$), i.e. $I(X,Y)$ and/or $I(V_X, V_Y)$, for a plurality of X,Y values. For purposes of illustration, the displacements ($\Delta X$, $\Delta Y$) of the primary axis 110 with respect to arbitrary X- and Y-axes associated with the reference aperture 132 are indicated, and a total displacement is shown as 209.

Evaluation of the detected beam current permits determination of beam drift or beam misalignment. The alignment deflection drive $V_a$ causes the CPB to align with reference aperture 132, or causes the CPB beam (or the center axis of the CPB beam) to pass the reference location 260. The alignment deflection drive may be determined based on the detected beam current. For example, the alignment deflection drive $V_a$ is the deflection drive corresponding to a maximum beam current obtained by scanning the CPB relative to reference aperture 132. In another example, the alignment deflection drive $V_a$ can be the beam deflection drive when the beam current exceeds a threshold current value. The threshold current value may be predetermined during initial system calibration. Changes in the alignment deflection drive indicate beam misalignment. A correction to the working deflection drive may be derived based on the change of the alignment deflection drive.

Alternatively, as shown in FIG. 2B, the beam deflector 122 can scan the CPB along one or more axes transverse to the axis 110 such as representative orthogonal axes 224, 226 and 234, 236 associated with beam locations 222, 232, respectively. Typically, scans along many such axes are executed. As shown in FIG. 2C, scan axes such as 244, 246 can be used that are at an arbitrary orientation with respect to coordinates axes associated with X, Y coordinates. Other scan patterns such as W-shapes or spirals can also be used.

The reference location in the system is determined based on one or more of the location, size, or shape of the detector. The reference location may further be determined based on the location of the beam deflector (such as the beam deflector 122 of FIG. 1). It is convenient to define a reference location based on a center of a reference aperture, but other locations such as aperture edges or other locations with the aperture can be used as a reference location. The reference aperture may be defined by the CPB detector, such as the detection surface of the CPB detector. The reference point may be on the detection surface of the detector, such as the center of the detection surface. In some examples, the reference aperture may be an aperture plate positioned upstream of the CPB detector, for allowing a portion of the CPB reaching the CPB detector. In some examples, the reference location is in the same plane of the reference aperture or on the CPB detector. In some examples, the reference location may not be in the same plane of the CPB detector or the reference aperture.

Example 3

Figure 3:
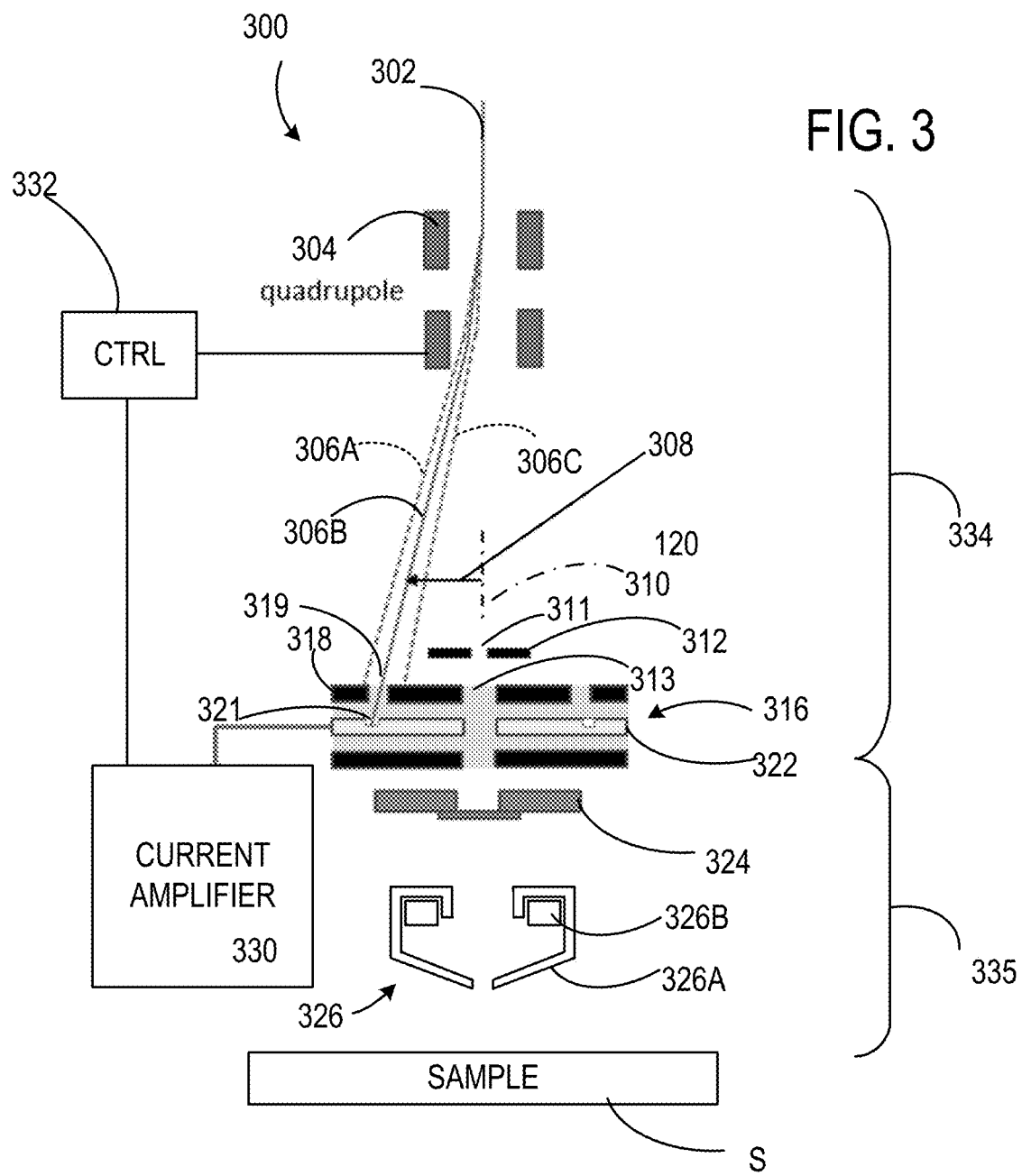
FIG. 3 illustrates another representative CPB microscope.

With reference to FIG. 3, a CPB system 300 includes a CPB source that directs a CPB 302 to a quadruple beam deflector 304 that is operable to deflect the CPB 302 to propagate along axes such as axes 306A-306C. A deflected beam propagating along the axis 306B has a transverse offset 308 from a primary axis 310 and is directed to a reference aperture 319 that is defined in a first electrode 318 of an alpha zoom lens (AZL) 316. A beam propagating along the primary axis 310 is directed to an aperture 313 defined in the AZL 316 and through an aperture 311 defined in an aperture plate 312. The AZL 316 also includes a middle electrode 322 that has a recess 321 situated to receive at least portions of a CPB incident on the aperture 319 and serve as a Faraday cup. The middle electrode 322 is coupled to a current amplifier 330 and produces a signal associated with received beam current and couples the signal to a control system 332 that can also supply drive signals to the beam deflector 304. As discussed above, the deflector drive signal is varied to establish beam displacement from the primary axis 310 so that suitable deflection drive values can be stored and used to direct the CPB as intended, typically along the axis 310 during imaging or processing operations. The CPB system 300 also includes an isolation valve 324 that hermetically separates an upper chamber region 334 from a lower chamber region 335. An objective lens 326 is situated to direct the CPB to a sample S. As shown in FIG. 3, the objective lens 326 is a magnetic lens and includes one or more pole pieces such as pole piece 326A and one or more coils such as coil 326B. Stigmator electrodes, scanning coils, beam limiting apertures and additional lenses such as electrostatic lenses can be situated within or near the objective lens 326. In this example, some apertures and beam detection electrodes are provided in the AZL 316, and separate components are not required. In addition, because the reference aperture 319 is defined in the AZL 316, the reference aperture 319 tends to remain fixed and aligned with respect to an axis of the AZL 316. Based on displacement of the CPB 302 from the reference aperture 319, and the predetermined displacement of the reference aperture 319 from the primary axis 310, a suitable deflection can be applied to align the CPB 302 with the primary axis 310.

Example 4

Figure 4:
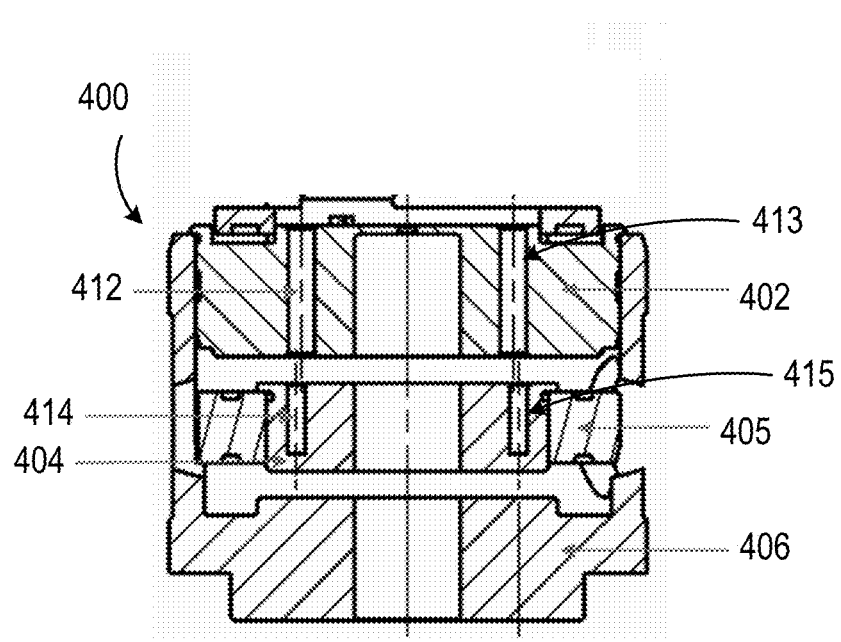
FIG. 4 illustrates a representative AZL lens that includes a reference aperture and Faraday cup.

Referring to FIG. 4, an example AZL 400 such as used in the CPB system 300 shown in FIG. 3 includes an upper electrode 402, a middle electrode 404, and a lower electrode 406. The upper electrode 402 defines a bore 412 or a CPB transmission region that permits a deflected CPB to reach a recess 414 that serves as a Faraday cup. The bore 412 can serve to define a reference aperture. A feed-through 405 electrically couples the upper electrode 402 and the lower electrode 406. In the example of FIG. 4, a reference aperture and Faraday cup are defined in the AZL 400, and additional CPB optical components are not needed for detecting the deflected beam. In addition, a second bore 413 defines a second reference aperture that is coupled to a second recess 415 that can serve as an additional Faraday cup, if desired.

Example 5

Figure 5C:
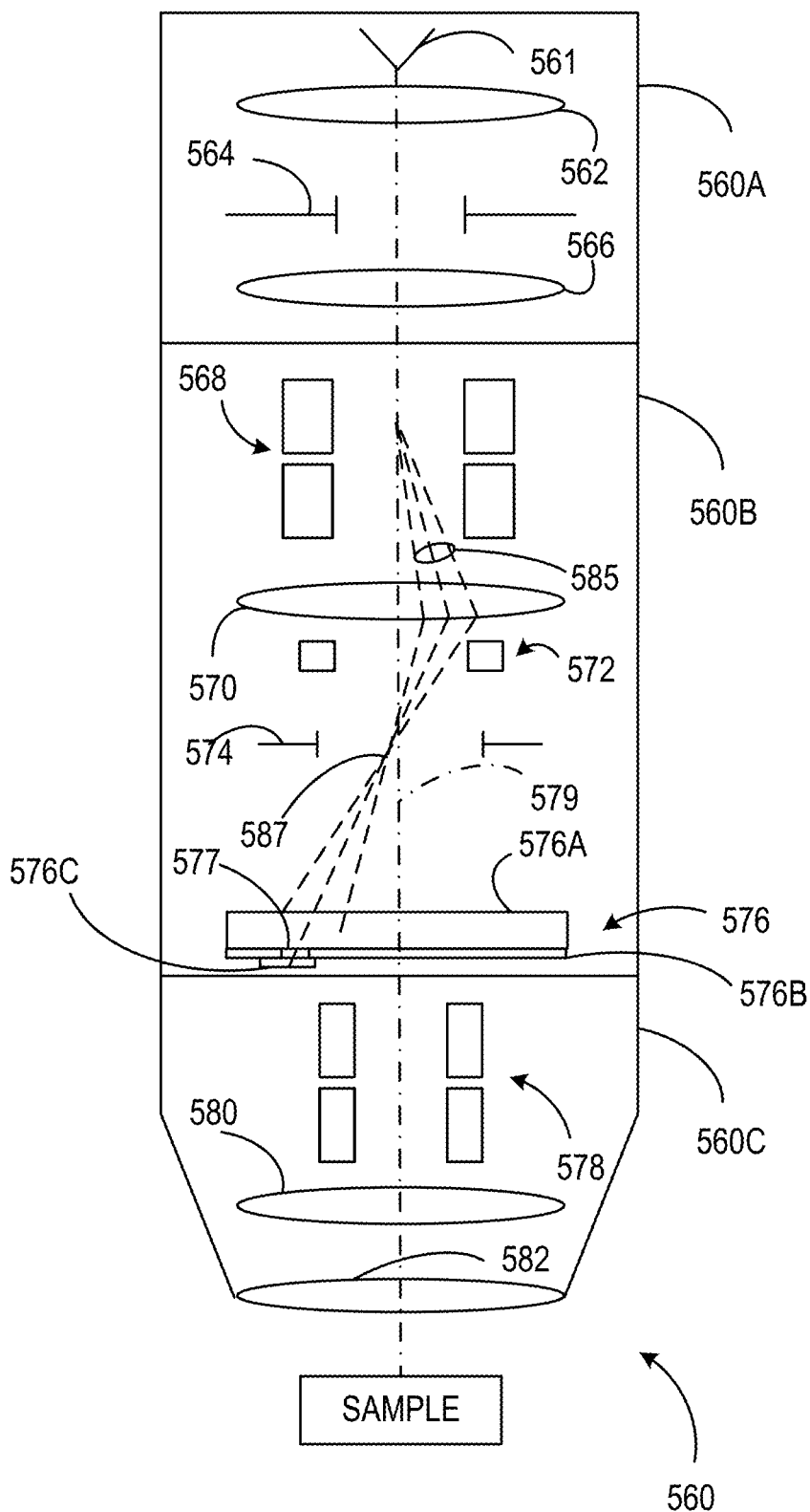
FIG. 5C illustrates a CPB column that includes a beam deflector used to align a CPB with a preferred axis.

FIG. 5C illustrates a representative CPB system 560 that includes a gun section 560A, a midsection 560B, and an objective lens sections 560C that direct a scanned CPB to a sample. Some or all of the sections 560A-560C can be separated with vacuum valves for independent vacuum isolation, but such valves are not shown. The gun section 560A includes a CPB source 561 that directs a CPB to a first condenser lens 562, an aperture plate 564 and a second condenser 566 to form a CPB that is then directed to the midsection 560B. The midsection 560B includes a quadrupole beam deflector 568 that can be activated to deflect the CPB that is then directed to a second condenser lens 570. A beam blanker 572 permits additional deflection of the CPB so that the sample remains unexposed and the CPB can be shaped or blocked with at aperture plate 574.

A lens assembly 576 is situated to receive the CPB from the second condenser lens 570, and can include one or more lens elements such as lens element 576A as well as an aperture plate 576B (which can serve as a lens element as well), and a detector 576C situated to receive portions of the CPB from a reference aperture 577 defined in the aperture plate 576B. In other examples, CPB detectors and apertures are provided at different locations and not necessarily as part of a lens assembly. The quadrupole beam deflector 568 can be energized to direct the CPB to the reference aperture 577. Based on a predetermined offset of the reference aperture 577 with respect to an intended CPB optical axis 579, beam deflection provided by the quadrupole beam deflector 568 can be used to determine errors in CPB propagation and apply suitable correction or compensation deflections to align the CPB with the intended CPB optical axis 579. As shown in FIG. 5C, a CPB 585 is deflected by the quadrupole beam deflector 568 to form a cross-over 587 that is displaced from the intended optical axis 579 so that the CPB 585 is incident on the reference aperture 577. With a predetermined displacement of the reference aperture 577 from the intended CPB optical axis, a deflection to be applied by the quadrupole beam deflector 568 can be selected to align the CPB with the intended CPB optical axis. Such compensation is described in more detail in FIGS. 5A-5B below.

With suitable CPB corrections applied, the CPB is directed to an octupole beam scanner 578 or other beam scanner and then to one or more lenses such as a lens 580 suitable for high resolution imaging and a lens 582 suitable to provide ultrahigh resolution. Typically, the CPB is scanned with respect to the sample using the beam scanner 578 with the quadrupole deflector activated to align the CPB with respect to the intended CPB axis 579. During typical image acquisition (or working mode), a suitable compensation deflection is applied. At other times, a series of compensation deflections are applied so that a suitable compensation deflection can be applied.

FIGS. 5A-5B illustrate portions of CPB columns similar to that shown in FIG. 5C in which beam crossovers are at different offsets with respect to an axis and beam deflectors can be used to align CPB beams. Some objective lenses are not shown, and beam scanners using in scanning a sample for imaging (such as the octupole scanner 578) are illustrated generally as 590 in FIGS. 5A-5B. As shown in FIG. 5A, in a working or imaging mode, a CPB system 500 directs a CPB 501 to a beam deflector 502. As shown in FIG. 5A, the beam deflector 502 is configured to direct to CPB lenses 504, 506 to form a crossover 508 that is located on a CPB system axis (or primary axis) 512. The CPB then propagates to a beam defining aperture 510. The CPB 501 is then directed through a CPB lens 514 along the axis 512 to additional CPB optics 590 and a specimen. Beam current as a function of offset with respect to the axis 512 is shown in curve 520. A suitable beam deflection is applied with the beam deflector 502 so that the CPB propagates along the axis 512. This axis-aligned beam can then be scanned with one or more additional beam deflectors that are typically associated with one or more objective lenses.

FIG. 5B illustrates determination of a beam deflection to be applied by the beam deflector 502 to align the CPB in the alignment mode. As shown, the beam deflector 502 is energized to produce a beam deflection so that a beam crossover 528 is produced. With a suitable deflection, the CPB is directed to a reference aperture 523 defined in a first electrode 522 of the CPB lens 514 for charge collection at a cavity 524 serving as a Faraday cup in a middle electrode 526. Detected beam current as a function of beam offset from alignment with the reference aperture 523 is shown in curve 540. The curve 540 permits determining a beam deflection with respect to the axis 512, and this can be used to establish a beam deflection needed to center or otherwise deflect the CPB 501 with respect to a specimen or a beam defining aperture such as the beam defining aperture 510. With such a beam deflection applied, a beam deflector used for sample scanning can be activated for sample imaging or sample processing in the working mode. In typical examples, the CPB lens 506 is a magnetic lens and produces rotation as well as displacement, but rotations are not shown.

Example 6

Figure 6:
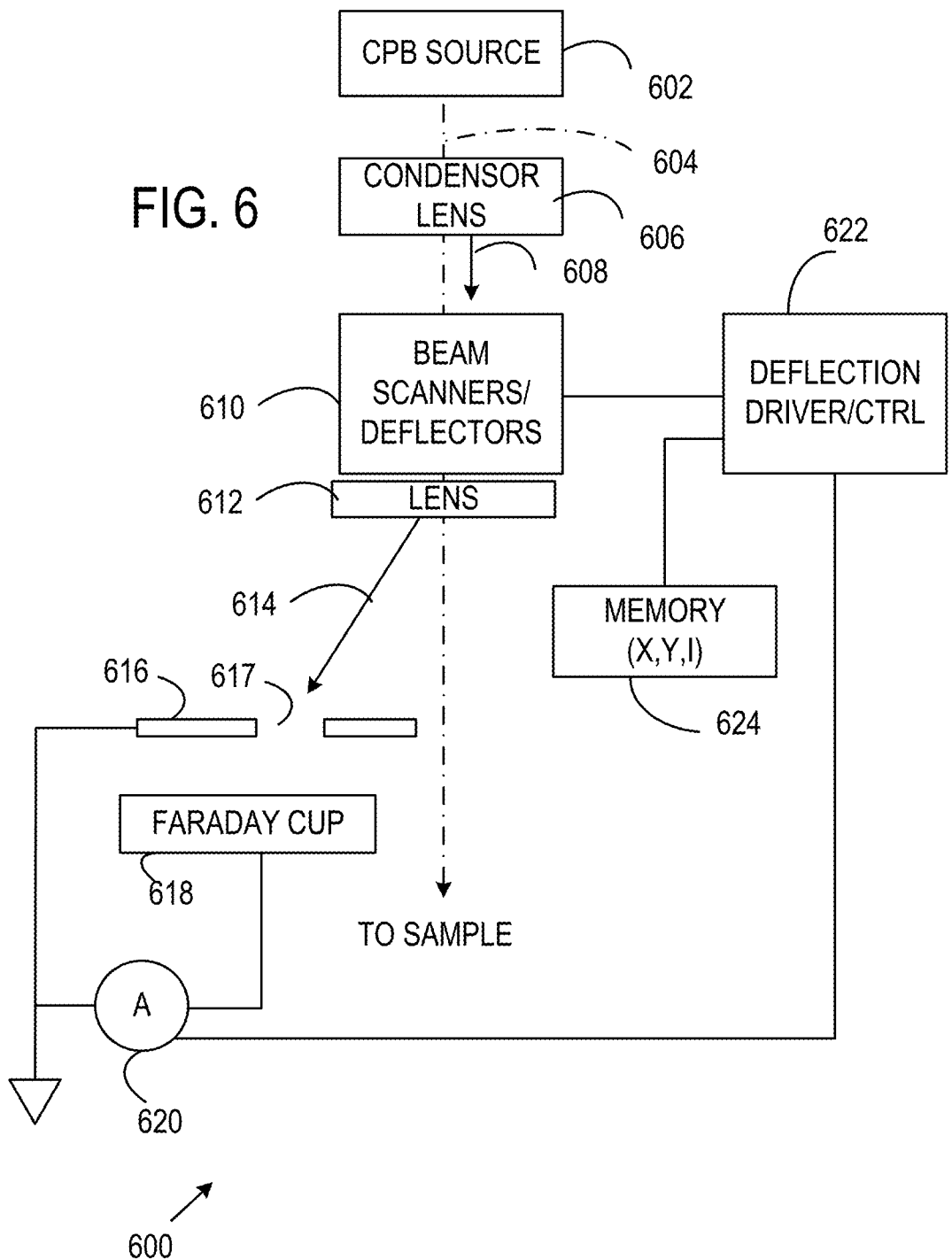
FIG. 6 illustrates another representative CPB system that includes beam deflection-based CPB alignment.

Referring to FIG. 6, a CPB source 602 such as a field emission source is coupled to a condenser lens 606 to produce a CPB 608 that is intended to propagate along a preferred axis 604. As shown, the CPB 608 generally does not propagate along the preferred axis 604, and even if the CPB 608 did so as originally aligned, subsequent misalignments would cause a CPB beam offset. The CPB 608 can be a collimated, converging, or diverging beam upon exit from the condenser lens 606. One or more beam scanners or deflectors 610 and one or more CPB lenses such as representative lens 612 may be situated to receive the CPB 608 from the condenser lens 606. A beam deflection driver and/or controller 622 is coupled to the beam scanner/deflector 610 to produce a deflected beam 614. The deflected beam 614 is scanned with respect to an aperture 617 defined by an aperture plate 616, and transmitted portions of the beam are detected with a Faraday cup 618. Detected CPB current is measured with a current meter 620 and measured values are coupled to the deflection driver/controller 622.

The deflection driver/controller 622 directs the deflected beam in a raster pattern, along a plurality of orthogonal axes, or otherwise over the aperture plate 616 and records currents determined by the current meter 620. The reference aperture 617 is typically fixed with respect to the preferred axis 604 and offsets ($\Delta X, \Delta Y$) of the reference aperture and the preferred axis 604 are stored. Beam deflection values that center the deflected beam 608 in the aperture 617 are determined, and based on the offsets ($\Delta X, \Delta Y$), beam deflector drive values that cause the deflected beam 608 to propagate along the axis 604 are determined. The beam scanner/deflector 610 can be used to produce an arbitrary beam offset from the preferred axis 604, and thus compensate beam position errors at any location along the preferred axis 604.

The recorded currents (I) and beam deflection values (X, Y) or scanner drive values ($V_X, V_Y$) are stored in a memory 624 and can be presented to a user on a display as an image, but generally are processed by the deflection driver 622 or with a separate processor to establish drive values associated with beam centration in the reference aperture 617 without a visual display.

Example 7

Figure 7:
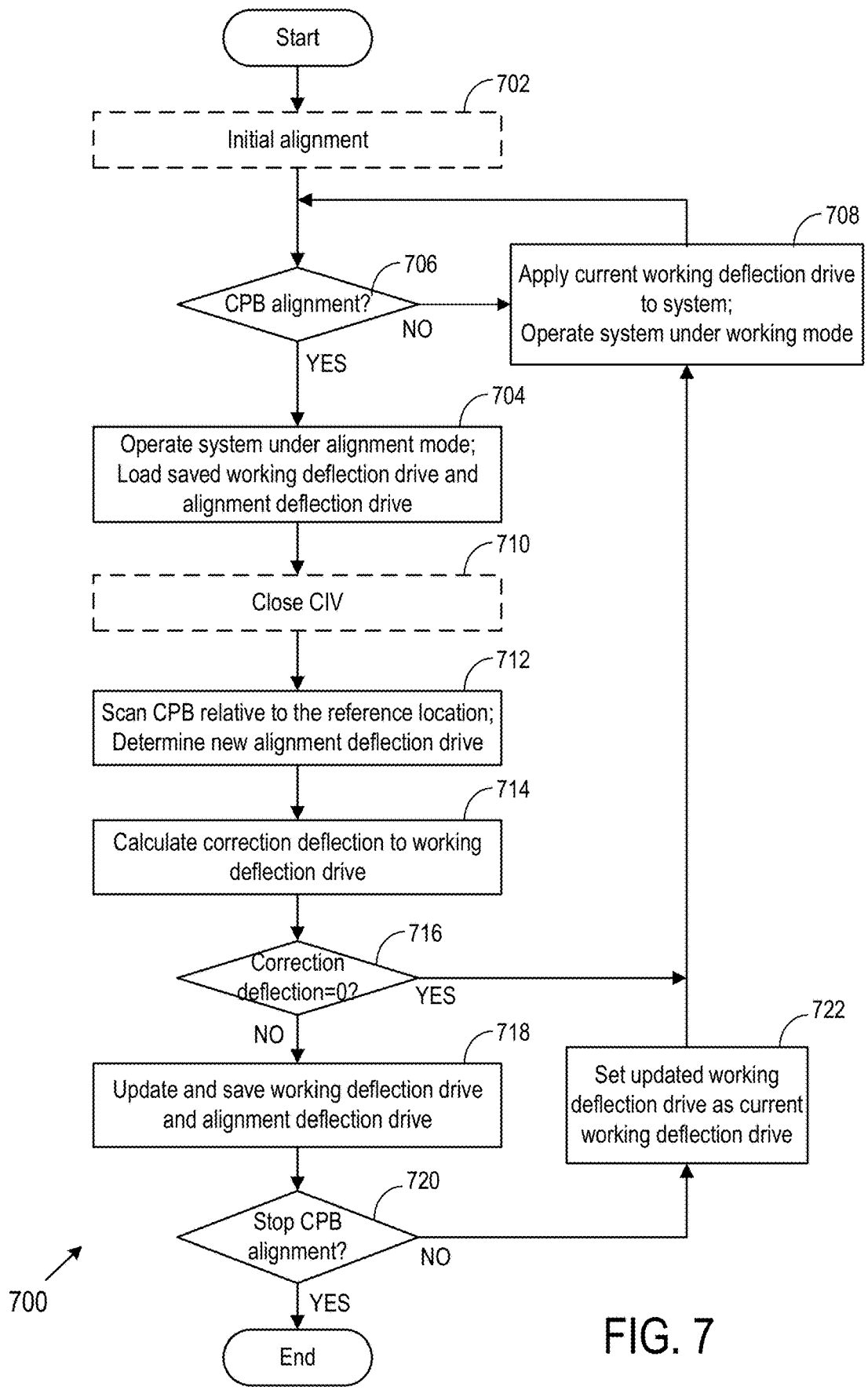
FIG. 7 illustrates a representative method of CPB alignment.

FIG. 7 illustrates a representative method 700 for detecting CPB misalignment and aligning the CPB to the primary axis. During CPB alignment, the working deflection drive value applied to the beam deflector (such as beam deflector 122 of FIG. 1) is updated by applying a correction deflection. The working deflection drive can direct the CPB along the primary axis during normal system operation, such as sample processing and sample imaging. The correction deflection is determined based on the change of the alignment deflection drive values. The alignment deflection drive values can direct the CPB to propagate through a reference location displaced from the primary axis. The reference location may be the center of a reference aperture or the center of a detection surface of the detector. The working deflection drive values and the alignment deflection drive values may each include two components for deflecting the beam in two orthogonal directions. The alignment deflection drive is determined by scanning the CPB relative to the reference location. Method 700 may be implemented by executing instructions saved on the non-transitory memory of the imaging system. Method 700 may be initiated from system power-on.

At 702, an initial alignment is optionally performed to determine the initial working deflection drive values and the initial alignment deflection drive values for the beam deflector. The initial alignment may be performed during an in-factory alignment or during system service. The initial working deflection drive values and alignment deflection drive values may be stored in the non-transitory memory of the imaging system.

At 704, the working deflection drive ($V_o$) and the alignment deflection drive ($V_a$) are loaded from the non-transitory memory of the imaging system.

At 706, it is determined whether CPB propagation is to be aligned. In one example, CPB alignment is performed at fixed time intervals. In another example, CPB alignment is performed in response to operator or technician initiation. In another example, CPB alignment is performed during sample exchange. In yet another example, CPB alignment is performed during system venting or pumping. The CPB may be aligned when there is no sample on the sample holder. If alignment is not selected, at 708, the current working deflection drive is used during the system working mode. For example, the current working deflection drive is applied to the beam deflector during sample imaging or sample processing. Further, method 700 continues monitoring system condition at 708. If additional CPB alignment is determined, the system enters the alignment mode.

At 710, the CIV valve may optionally be closed. Upon closing the CIV valve, the first volume and the second volume (such as the first volume 112A and the second volume 112B of FIG. 1) of the vacuum chamber are hermetically separated, and the CPB beam does not enter the second volume or irradiate the sample.

At 712, the CPB is scanned with respect to a reference location to determine the new alignment deflection drive ($V_a'$). For example, as shown in FIG. 2, the beam deflector drives the CPB to scan the reference aperture displaced from the primary axis. The CPB scan is based on the current alignment deflection drive loaded at 704. For example, the beam deflector may be driven to scan the reference aperture by providing the beam deflector with an oscillating scan signal added to the alignment deflection drive value. The reference aperture may be defined by the detector displaced from the primary axis. While scanning the CPB, the deflection drive values and the corresponding beam current of the scanning beam passing the reference aperture may be recorded. The alignment deflection drive values may be determined based on the recorded beam current. For example, the alignment deflection drive values are the deflection drive values correspond to the maximum detected beam current.

At 714, the correction deflection ($V_c$) for the working deflection drive is calculated based on the change of the alignment deflection drive values. For example, the correction deflection may be determined based on the difference between the new alignment deflection drive determined at 712 and the current alignment deflection drive loaded at 704, that is ($V_a'-V_a$). In one example, the correction deflection may be proportional to the change of the alignment deflection drive. The correction deflection may be the change of the alignment deflection drive weighted by a weighting factor. The weighing factor may be system specific and pre-determined. In some examples, it may be necessary to compensate for system nonlinearity in determining the correction deflection. The correction deflection is zero if the newly measured alignment deflection drive is the same as the loaded (or current) alignment deflection drive at 704.

At 716, if the correction deflection is zero, no further CPB adjustment is needed, and method 700 proceeds to step 708. Otherwise, at 718, the working deflection drive and the alignment deflection drive are updated and saved. The working deflection drive may be updated by applying the correction deflection to the current working deflection drive loaded at 704. For example, the working deflection drive may be updated by adding the correction deflection to the current working deflection drive, that is ($V_c+V_o$). The updated alignment deflection drive may be the new alignment deflection drive determined at 712.

At 720, if the CPB alignment is stopped, method 700 exits. The CPB alignment may be stopped for example response to system power down, operator's command, or system shutdown. Otherwise, the updated working deflection drive is set as the current working deflection drive at 722 and applied in the system working mode at 708.

Example 8

Figure 8:
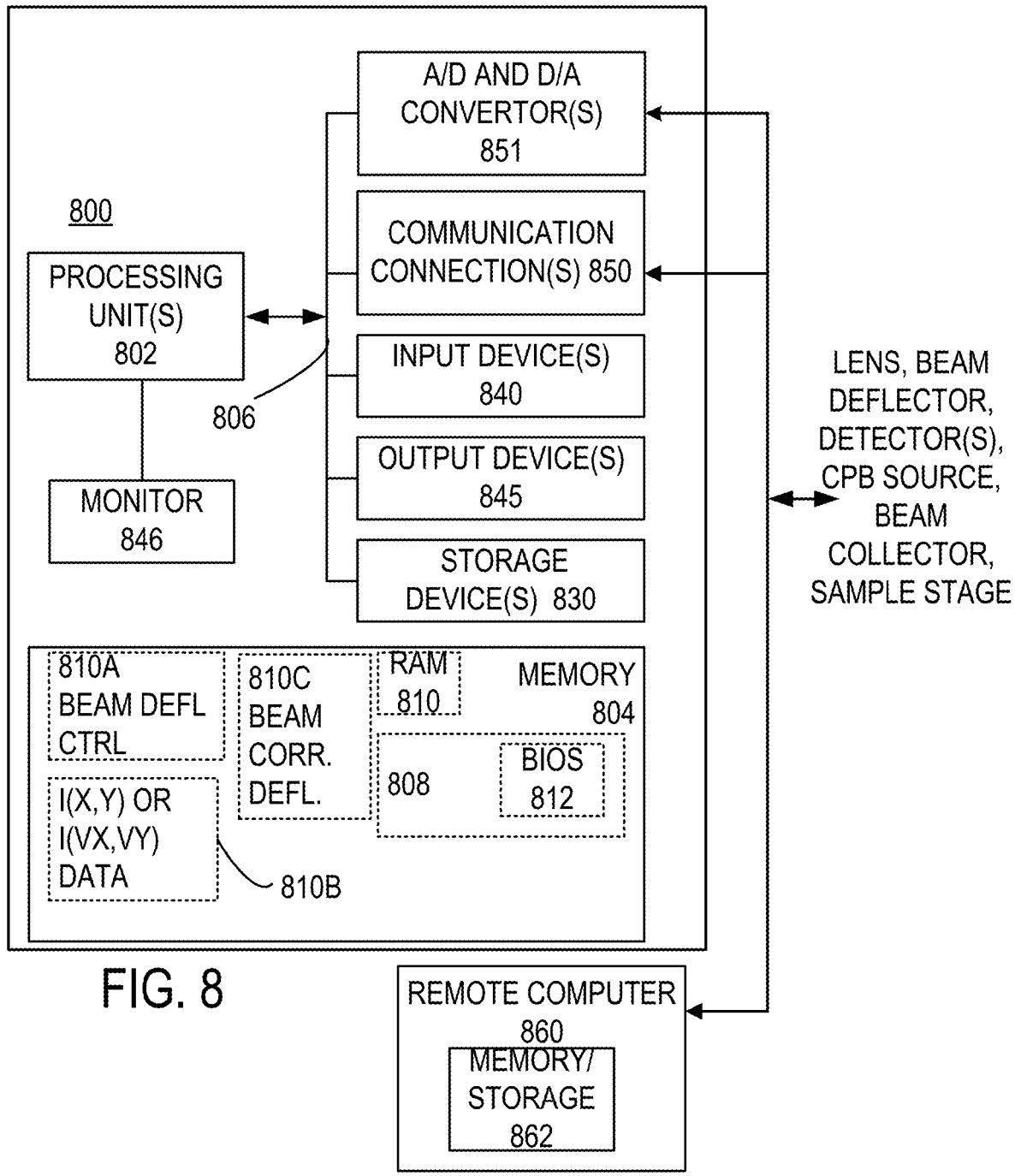
FIG. 8 illustrates a representative computing and control environment of the disclosed methods and apparatus.

FIG. 8 and the following discussion are intended to provide a brief, general description of an exemplary computing environment in which the disclosed technology may be implemented. Moreover, the disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 8, an exemplary system for implementing the disclosed technology includes a general purpose computing device in the form of an exemplary conventional PC 800, including one or more processing units 802, a system memory 804, and a system bus 806 that couples various system components including the system memory 804 to the one or more processing units 802. The system bus 806 may be any of several types of bus structures including a memory bus or memory controller, a peripheral bus, and a local bus using any of a variety of bus architectures. The exemplary system memory 804 includes read only memory (ROM) 808 and random access memory (RAM) 810. A basic input/output system (BIOS) 812, containing the basic routines that help with the transfer of information between elements within the PC 800, is stored in ROM 808. In the example of FIG. 8, data and processor-executable instructions for control, analysis, imaging, and other operational modes of a CPB system including control of beam deflectors, determination of beam deflections corresponding to a reference location such as a reference aperture are stored in a memory 810A. Beam deflection values such as reference values and images I(X,Y) or I($V_X,V_Y$) are stored in a memory 810B, and correction values or reference values are stored in a memory 810C.

The exemplary PC 800 further includes one or more storage devices 830 such as a hard disk drive for reading from and writing to a hard disk, a magnetic disk drive for reading from or writing to a removable magnetic disk, and an optical disk drive. Such storage devices can be connected to the system bus 806 by a hard disk drive interface, a magnetic disk drive interface, and an optical drive interface, respectively. The drives and their associated computer readable media provide nonvolatile storage of computer-readable instructions, data structures, program modules, and other data for the PC 800. Other types of computer-readable media which can store data that is accessible by a PC, such as magnetic cassettes, flash memory cards, digital video disks.

A number of program modules may be stored in the storage devices 830 including an operating system, one or more application programs, other program modules, and program data. A user may enter commands and information into the PC 800 through one or more input devices 840 such as a keyboard and a pointing device such as a mouse. A monitor 846 or other type of display device is also connected to the system bus 806 via an interface, such as a video adapter.

The PC 800 may operate in a networked environment using logical connections to one or more remote computers, such as a remote computer 860. In some examples, one or more network or communication connections 850 are included. The remote computer 860 may be another PC, a server, a router, a network PC, or a peer device or other common network node, and typically includes many or all of the elements described above relative to the PC 800, although only a memory storage device 862 has been illustrated in FIG. 8. The personal computer 800 and/or the remote computer 860 can be connected to a logical a local area network (LAN) and a wide area network (WAN).

GENERAL CONSIDERATIONS

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

In view of the many possible embodiments to which the principles of the disclosure may be applied, it should be recognized that the illustrated embodiments are only examples and should not be taken as limiting the scope of the disclosure.

We claim:

1. A method for operating a charged-particle beam (CPB) microscope, comprising:
    providing a first beam deflection drive to a beam deflector to direct a CPB passing a reference location displaced from a primary axis, wherein the reference location is associated with a CPB detector and the first beam deflection drive directs at least a portion of the CPB onto the detector; and
    providing a second beam deflection drive to the beam deflector to propagate the CPB along the primary beam axis, wherein the second beam deflection drive is determined based on the first beam deflection drive.

2. The method of claim 1, wherein directing the CPB passing a reference location includes directing a central axis of the CPB passing a reference location.

3. The method of claim 1, further comprising scanning the CPB relative to the reference location; and determining the first beam deflection drive based on the scanned CPB received by the detector.

4. The method of claim 3, wherein the detector is displaced from the primary axis.

5. The method of claim 3, wherein the first beam deflection drive is determined based on a beam current received by the detector.

6. The method of claim 3, wherein the first beam deflection drive is determined based on an image of at least a portion of the scanning CPB beam detected by the detector.

7. A method for operating a charged-particle beam (CPB) microscope, comprising:
    isolating a first portion of a vacuum enclosure of the CPB microscope from a second portion of the vacuum enclosure of the CPB microscope with at least one valve, wherein a sample holder is situated in the second portion;
    with the first portion of the vacuum enclosure of the CPB microscope isolated from the second portion, operating the CPB microscope in an alignment mode and determining a first beam deflection drive to a beam deflector to direct a CPB passing a reference location displaced from a primary axis; wherein the reference location is associated with a CPB detector and the first beam deflection drive directs at least a portion of the CPB onto the detector;
    with the at least one valve, coupling the first portion of the vacuum enclosure to the second portion of the vacuum enclosure; and
    with the first portion of the vacuum enclosure coupled to the second portion of the vacuum enclosure, operating the CPB microscope in a working mode and providing a second beam deflection drive to the beam deflector to propagate the CPB along the primary beam axis, the second beam deflection drive determined based on a first beam deflection drive value.

8. The method of claim 7, wherein the second beam deflection drive is constant during the working mode.

9. The method of claim 7, further comprising after operating the CPB microscope in the working mode, operating the CPB microscope in the alignment mode and updating the first beam deflection drive.

10. The method of claim 9, further comprising determining a correction deflection based on a change in the first beam deflection drive; updating the second beam deflection drive based on the correction deflection; and providing the updated second beam deflection drive to the beam deflector when operating the CPB microscope during the working mode.

11. A charged-particle beam (CPB) microscope, comprising:
    a source for generating a CPB;
    a beam deflector for deflecting the CPB with respect to a primary axis;
    a detector displaced from the primary axis for CPB alignment; and
    a controller with a processor and computer readable instructions stored in a non-transitory memory, the controller is configured to:
        providing a first beam deflection drive to the beam deflector to direct the CPB passing a reference location displaced from a primary axis, wherein the reference location is defined by the detector, wherein the first beam deflection drive directs at least a portion of the CPB onto the detector; and
        applying a second beam deflection drive to the beam deflector to propagate the CPB along the primary beam axis and irradiate a sample, the second beam deflection drive determined based on a first beam deflection drive value.

12. The CPB microscope of claim 11, wherein the controller is further configured to: determine the first beam deflection drive by scanning the CPB relative to the detector with the beam deflector.

13. The CPB microscope of claim 11, wherein the detector is a Faraday cup.

14. The CPB microscope of claim 11, further includes a sample holder, and a second beam deflector positioned downstream of the beam deflector for scanning the CPB propagated along the primary axis relative to the sample holder.

15. The CPB microscope of claim 11, wherein the controller is further configured to: maintain the first beam deflection drive value provided to the beam deflector during a working mode; and provide an oscillating beam deflection drive to the beam deflector during a microscope alignment mode.

16. The CPB microscope of claim 11, further comprising a second detector for detecting flux emitted from the sample responsive to the irradiation of the CPB.

17. The CPB microscope of claim 11, wherein the second beam deflection drive is determined without a sample held by the sample holder.

18. The CPB microscope of claim 11, further comprising an objective lens positioned downstream of the beam deflector to direct the CPB towards a sample.

19. The CPB microscope of claim 11, further comprising a vacuum isolation valve that defines a first portion and a second portion of a vacuum enclosure, wherein the CPB source and the beam deflector are situated in the first portion and a sample holder is situated in the second portion.

* * * * *